United States Patent [19]

Frank

[11] Patent Number: 5,083,368
[45] Date of Patent: Jan. 28, 1992

[54] METHOD OF FORMING MODULAR POWER DEVICE ASSEMBLY

[75] Inventor: Randall K. Frank, Scottsdale, Ariz.

[73] Assignee: Motorola Inc., Schaumburg, Ill.

[21] Appl. No.: 589,134

[22] Filed: Sep. 27, 1990

Related U.S. Application Data

[62] Division of Ser. No. 479,924, Feb. 14, 1990, Pat. No. 4,991,002.

[51] Int. Cl.$^5$ .............................................. H05K 3/34
[52] U.S. Cl. ........................................ 29/840; 29/832; 165/80.3; 174/16.3; 361/386
[58] Field of Search ...................... 357/81; 165/80.3; 29/832; 361/386, 403; 174/16.3

[56] References Cited

U.S. PATENT DOCUMENTS

| | | | |
|---|---|---|---|
| 3,574,815 | 4/1971 | Segerson | 264/269 |
| 3,606,673 | 9/1971 | Overman . | |
| 4,012,765 | 3/1977 | Lehner et al. | 357/70 |
| 4,204,248 | 5/1980 | Proffit et al. | 361/388 |
| 4,288,839 | 9/1981 | Prager et al. | 361/386 |
| 4,298,883 | 11/1981 | Komatsu et al. | 357/72 |
| 4,451,973 | 6/1984 | Tateno et al. | 29/588 |
| 4,510,519 | 4/1985 | Dubois et al. | 357/81 |
| 4,589,010 | 5/1986 | Tateno et al. | 357/70 |
| 4,602,315 | 7/1986 | Breese | 361/386 |
| 4,648,008 | 3/1987 | Neyroud et al. | 361/387 |
| 4,756,081 | 7/1988 | Penn | 29/832 |
| 4,867,235 | 9/1989 | Grapes et al. | 357/81 X |
| 4,933,746 | 6/1990 | King | 165/80.3 X |
| 4,935,086 | 6/1990 | Baker et al. | 29/832 X |

FOREIGN PATENT DOCUMENTS

6398135 10/1986 Japan .
63-228650 9/1988 Japan .

OTHER PUBLICATIONS

Gaun et al., "Three Piece Solution for Brushless Motor Controller Design", Motorola Semiconductor Application Note, Document No. AN1046, 1989.
Schultz, "A Simple Brush Type DC Motor Controller", Motorola Semiconductor Application Note Document No. EB1231D, 1989.
Pauly, "High Fidelity Switching Audio Amplifiers Using TMOS Power MOSFETs", Motorola Semiconductor Application Note Document No. AN10421D, 1989.
Designers Data Sheet: "Full Pak Isolated TMOS E-FET High Channel Power MOSFET", Motorola Semiconductor Technical Data, Doc. #MTA3055/D, 1989.
"Full Pak Power Semiconductors for Isolated Package Applications", Motorola Document #SG,131D, 5/89.

Primary Examiner—Carl J. Arbes
Attorney, Agent, or Firm—Joe E. Barbee; Robert M. Handy

[57] ABSTRACT

Very compact, low cost power semiconductor device modules suitable for use in variable speed motor controllers multiple solenoid drivers, and the like are provided by attaching pre-packaged (e.g., type TO-220) semiconductor devices by their heat dissipation surfaces to opposed planar faces of a metal heat conduction plate using an electrically insulating and thermally conductive epoxy. By proper choice of the heat conduction plate thickness and the device-to-device spacing thereon, the leads of the pre-packaged devices can be arranged to have, on the modules, the same lead-to-lead and row-to-row spacing as for common JEDEC DILIC packages so that the modules fit on a conventional package footprint when mounted on a circuit board.

3 Claims, 2 Drawing Sheets

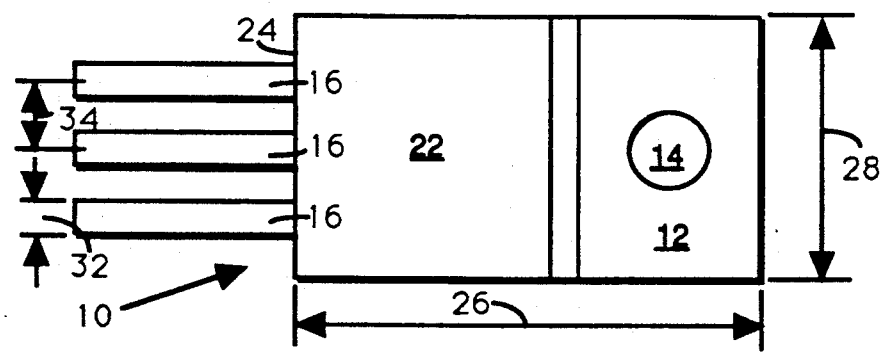
FIG. 1 PRIOR ART
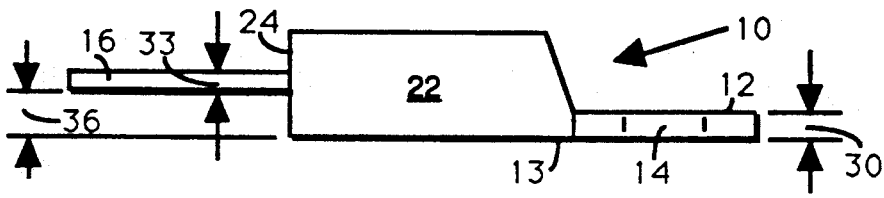
FIG. 2 PRIOR ART
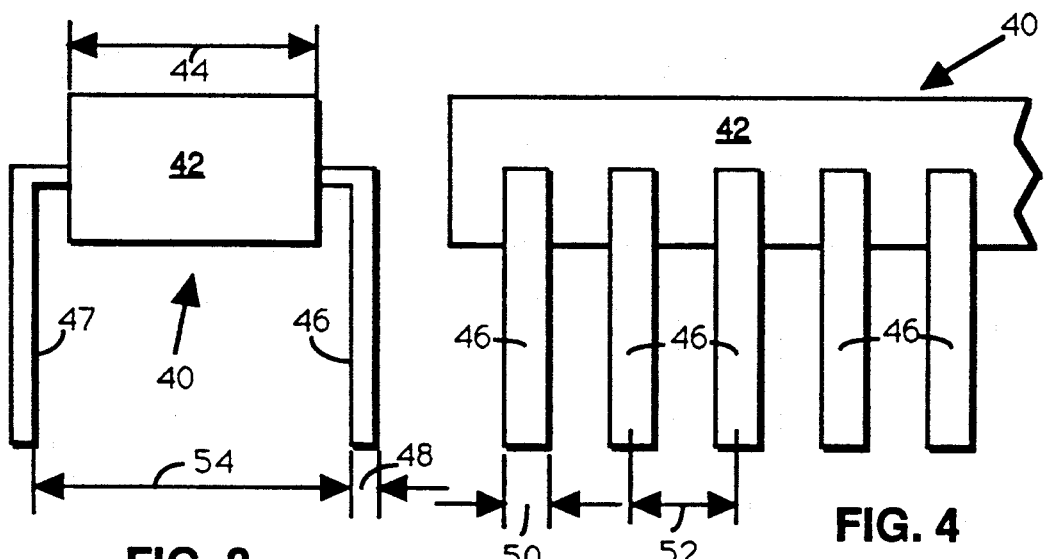
FIG. 3 PRIOR ART
FIG. 4 PRIOR ART
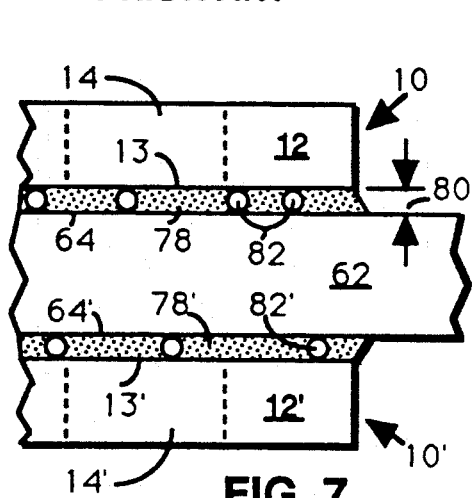
FIG. 7
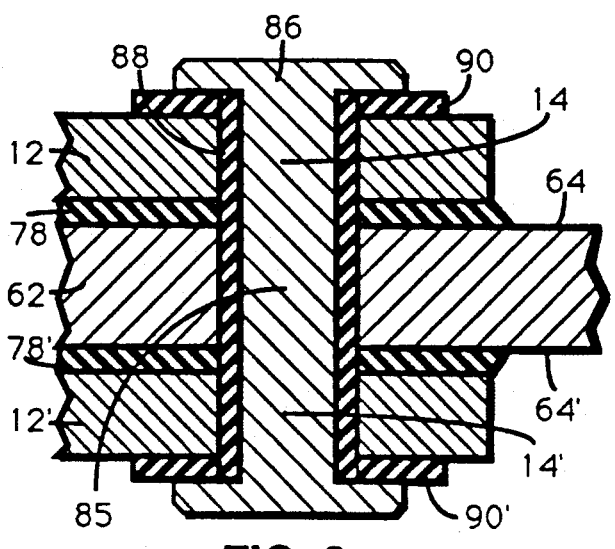
FIG. 8

METHOD OF FORMING MODULAR POWER DEVICE ASSEMBLY

This is a division of application Ser. No. 07/479,924, filed Feb. 14, 1990, now U.S. Pat. No. 4,991,002, issued Feb. 5, 1991.

FIELD OF THE INVENTION

The present invention concerns means and methods for packaging electronic devices and, more particularly, means and methods for combining pre-packaged power semiconductor devices into a modular assembly having a pre-determined footprint. As used herein the word "footprint" is intended to refer to the arrangement and dimensions of lead attachment locations or equivalent on the circuit board on which a pre-packaged electronic device or module is intended to be mounted to match the lead arrangement, spacing and body dimensions of the pre-packaged electronic device or module so that it fits in its assigned space on the circuit board and so that its external connection leads mate with the corresponding attachment locations on the circuit board.

BACKGROUND OF THE INVENTION

Packaged semiconductor devices typically comprise a semiconductor die containing one or more semiconductor elements, external leads by which the device is to be coupled to the circuit in which it is intended to function, bonding wires or equivalent connecting the semiconductor element(s) to the external leads, and a housing or encapsulation surrounding the die and the bonding wires to provide environmental protection. Many different forms of packaged semiconductor devices are known and used, ranging from a simple two lead diode to complex integrated circuits having millions of transistors and hundreds of external leads.

It is common to mount packaged semiconductor devices on circuit boards. Circuit boards generally comprise an insulating substrate having thereon one or more layers of conductors to which the various semiconductor devices and other electronic components attach at various attachment locations. In order to facilitate the design and assembly of circuit boards, certain package shapes, sizes and lead arrangements have been registered as "JEDEC" standards. JEDEC stands for Joint Electron Device Engineering Council JEDEC registered package designs have pre-determined mechanical dimensions and lead arrangements. Examples of well known JEDEC standard package configurations are 14 to 40 lead dual-in-line (DIL) packages, TO-3, TO-218 and TO-220 packages. The availability of a wide variety of semiconductor devices or functions in JEDEC standard package configurations greatly facilitates circuit board design because the device footprint on the circuit board is known from the JEDEC standard and does not depend on the particular manufacturer or the electrical function of the packaged device.

Many different types of power semiconductor devices are produced in JEDEC standard package configurations. As used herein, the words "power device" and "power semiconductor device" are intended to refer to devices composed of one or more electronic elements, wherein the device generally dissipates $\geq 10$ watts or carries a current of $\geq 1$ amp and blocks voltages of $\geq 40$ volts.

Frequently it is necessary to use multiple power devices to accomplish a particular electrical function. This is especially common in motor control circuits and multiple solenoid drivers where two to six or more power semiconductor devices may be required to drive a fractional horsepower variable speed motor or individual inductive loads. The rapid adoption of electronic controls and actuators in automotive and white goods applications has stimulated the use of multiple power device circuits for controls and switches. Historically, such circuits have been implemented by mounting the required number of power devices individually on the circuit board where they are interconnected into the desired electrical function. However, as the usage of multi-device control or driver circuits increases it becomes more desirable to have pre-packaged modules or sub-assemblies in which the individual power semiconductor devices are already grouped together since this simplifies circuit board construction.

One solution to the need for multiple device sub-assemblies has been to provide the multiple devices on a single semiconductor chip. This arrangement works well for low power applications (e.g., a few watts or less), as in conventional integrated circuits where individual active device areas are comparatively small and voltage and currents are low, but is not suitable for power device applications. This is because power devices generally require much larger active areas. It is well known that the cost of semiconductor devices increases very rapidly with device active area. For example, if it costs $ 4 \times$ to make four individual power transistors on separate die, it may cost $ \geq 40 \times$ to make a single semiconductor die with the same four power transistors thereon. A further difficulty with integrating multiple power devices on a single semiconductor chip is that it becomes much more difficult to provide electrical isolation between the devices, which is often necessary in multi-device control circuits where the multiple semiconductor devices do not operate in parallel.

Another approach that has been used in the prior art is to mount individual semiconductor die on a common support, connect them together and/or to external leads and then enclose the combination in a protective encapsulation. While this procedure is successful and widely used it suffers from a number of drawbacks well known in the art. For example, it is frequently impossible to provide a full functional test of the power semiconductor chip before it is assembled onto the common support. As a result, if the functional test of the assembled module shows that a particular die is defective, either the entire module must be discarded or the defective chip removed and replaced and the assembly re-tested. Such repair is usually a "by-hand" operation and is comparatively very expensive.

Thus, there continues to be a need for improved, low cost power device modules which are convenient to use. It is especially desirable to have modules whose footprint conforms to a JEDEC standard footprint so that custom circuit board mounting configurations are avoided.

SUMMARY OF THE INVENTION

It is an object of the present invention to provide an improved module of low cost and high performance containing multiple power semiconductor devices. It is a further objective to provide an improved module which takes advantage of well established manufacturing technology and individually pre-packaged devices. It is a still further object of the present invention to provide an improved module which is compatible with JEDEC standard device package footprints.

These and other objects and advantages are provided by a power semiconductor module comprising a plurality of pre-packaged semiconductor devices, each having a planar first face for heat removal and external electrical connection leads extending from a second face, and a heat conductive plate for receiving the plurality of pre-packaged semiconductor devices, wherein the planar first faces of a first portion of the plurality of pre-packaged semiconductor devices are in contact with a first face of the heat conductive plate and the planar first faces of a second portion of the plurality of pre-packaged semiconductor devices are in contact with an opposed second face of the heat conductive plate, and wherein the external electrical connection leads of the pre-packaged semiconductor devices all extend in a common direction away from the heat conductive plate.

It is desirable that the plurality of pre-packaged semiconductor devices are electrically isolated from the heat conductive plate. It is further desirable that the external electrical connection leads extend away from the heat conductive plate in at least two parallel rows, and more particularly that the external electrical connection leads of the first portion of the plurality of pre-packaged semiconductor devices lie in at least one plane substantially parallel to the first face of the conductive plate and the external electrical connection leads of the second portion of the plurality of pre-packaged semiconductor devices lie in at least one plane substantially parallel to the second face of the heat conductive plate. The external electrical connection leads of the first portion of the plurality of pre-packaged semiconductor devices desirably form a first row having a pre-determined lead-to-lead spacing and that the external electrical connection leads of the second portion of the plurality of pre-packaged semiconductor devices desirably form a second row having the same pre-determined lead-to-lead spacing and spaced from the first row by a pre-determined row-to-row spacing. It is desirable that the lead-to-lead and row-to-row spacing conform to a JEDEC lead-to-lead and row-to-row spacing.

The heat dissipation capability of the module is enhanced by providing on the heat conductive plate a finned heat radiator extending beyond the multiple pre-packaged power devices. The most compact arrangement is obtained when the plurality of pre-packaged semiconductor devices comprises an even number of pre-packaged semiconductor devices, one half of which are bonded on each of the planar faces of the heat conductive plate.

The above-described module is conveniently formed by attaching the heat removal faces of the individual pre-packaged semiconductor devices to the planar faces of the heat conductive plate by a bonding media such as for example, an epoxy resin with or without a filler material. Where the heat removal faces of the pre-packaged devices are also electrical conductors tied to one terminal of the semiconductor device, it is desirable to use electrically insulating fillers in the attachment media, as for example quartz beads, cloth or matting of predetermined and substantially uniform thickness. During assembly of the module, it is desirable to arrange the external leads of the pre-packaged devices so that they extend in parallel rows from the same side of the module and form two or more rows whose lead-to-lead and row-to-row spacing conform to a JEDEC standard.

Further understanding of the present invention will be obtained by considering the accompanying drawings and explanation thereof that follows.

DESCRIPTION OF THE DRAWINGS

FIG. 1 is a simplified front view of a type TO-220 packaged semiconductor, device according to the prior art;

FIG. 2 is a simplified side view of the device of FIG. 1;

FIG. 3 is a simplified end view of a DIL according to the prior art;

FIG. 4 is a simplified side view of a portion of the DIL of FIG. 3;

FIG. 7 is an end and partially cut-away view of a portion of the module shown in FIG. 6, somewhat enlarged and showing further details;

FIG. 8 is a simplified cross-sectional view of a portion of a module in the general location indicated in FIG. 5, but according to a further embodiment of the present invention;

DETAILED DESCRIPTION OF THE DRAWINGS

Figure 5:
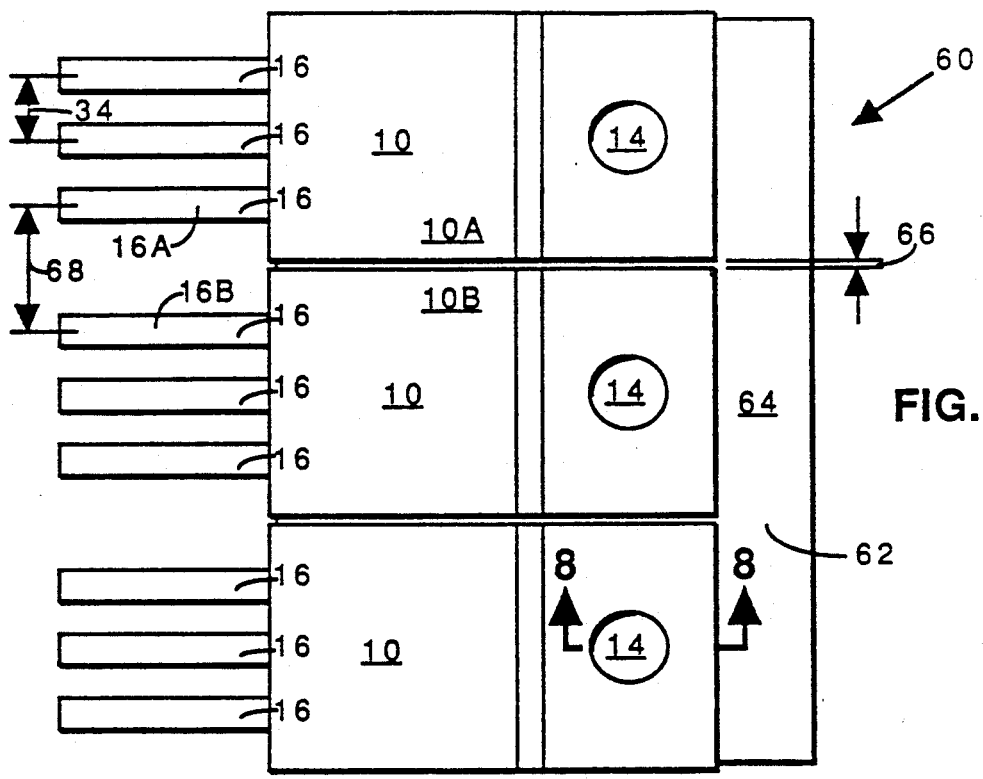
FIG. 5 is a front view of a module containing six pre-packaged type type TO-220 devices, mounted three on each side of a heat removal plate, according to the present invention.

FIGS. 1 and 2 show, respectively, simplified front and side views of a standard type TO-220 pre-packaged semiconductor device, according to the prior art. Device 10 tYpically comprises metal heat removal plate or flag 12 on which the semiconductor die (not shown) is bonded using means well known in the art. Plate 12 has therein mounting hole 14. Plate 12 has planar lower surface 13 which provides the mounting surface through which the majority of heat is removed from device 10. The semiconductor die within device 10 is connected to external electrical leads 16, typically by wire bonds (not shown) and covered by protective enclosure or encapsulation 22, generally a molded plastic. Leads 16 extend from side 24 of encapsulant 22. The JEDEC standard for a type TO-220 package specifies, among other things, device length and width 26, 28, heat removal plate thickness 30, lead width 32, lead thickness 33, lead center-to-center spacing 34, and distance 36 between leads 16 and mounting surface 13. Means and methods for fabricating tYpe TO-220 devices containing many different types of semiconductor devices, (e.g., diodes, transistors, thyristors, TRIACS, and the like) are well known in the art.

FIGS. 3–4 show, respectively, a simplified end view and side view of a dual-in-line (DIL) type package of which many variations having from 14 to 40 leads and different body widths (e.g., 7.6, 10.2, 15.2 mm) are JEDEC registered. DIL device 40 has body portion 42 of width 44, generally of ceramic or molded plastic, which contains the semiconductor die and any bonding wires attached thereto (not shown) and protruding external electrical connection leads 46, 47 of thickness 48, width 50 and center-to-center spacing 52. Leads 46, 47 generally form two parallel rows, hence the acronym "dual-in-line" which are separated by row-to-row spacing 54. Leads 46, 47 extend outwardly and downwardly from body 42 to form the two parallel rows.

Figure 6:
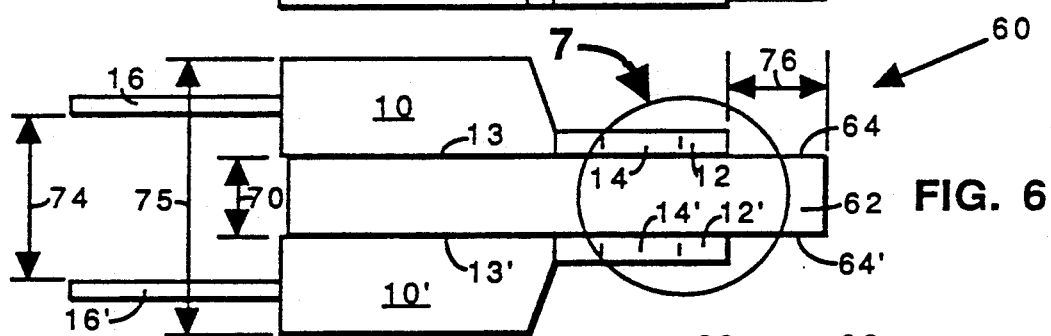
FIG. 6 is an end view of the module of FIG. 5.

FIGS. 5-6 show how the present invention provides an inexpensive and very compact semiconductor power device module which conforms to an established JEDEC footprint. FIG. 5 is a front view and FIG. 6 is an end view of a first embodiment of the module of the present invention. Module 60 comprises heat conduction plate 62 having planar front and back faces 64, 64' on which are mounted pre-packaged semiconductor devices 10, 10'(e.g., type TO-220). Pre-packaged devices 10, 10' are mounted with heat removal faces 13, 13' in thermal contact with faces 64, 64', respectively, of heat conduction plate 62. In the example shown in FIGS. 5-6, three pre-packaged devices 10, 10' are mounted on each planar face 64, 64' of heat conduction plate 62. Those of skill in the art will understand that more or fewer devices can be mounted on heat conduction plate 62. The most compact arrangement is obtained when there are an even number of devices 10, 10', evenly divided between front and back faces 64, 64'.

Heat conduction plate 62 is preferably arranged with respect to leads 16 so that leads 16 protrude beyond heat conduction plate 62. This permits leads 16 to be inserted in a circuit board without interference from plate 62. Spacing 66 between pre-packaged devices 10 on conduction plate 62 is arranged so that spacing 68 between neighboring leads 16A, 16B of adjacent devices 10A, 10B is an integer multiple of lead-to-lead spacing 34. This arrangement is replicated for each pre-packaged device 10 on plate 62.

Thickness 70 of plate 62, taking into account the thickness of any adhesive or other bonding means used for attaching devices 10, 10' to plate 62, is adjusted to provide predetermined row-to-row spacing 74 between leads 16, 16'. Plate 62 conveniently extends beyond devices 10, 10' by predetermined amount 76, but this is not essential.

In some instances it is useful if plate 62 extends beyond encapsulation 22 of device 10 in the direction of leads 16 so as to act as a mechanical stand-off for module 60 on the circuit board. Plate 62 may also penetrate through the circuit board and be attached thereto, for example, in the manner shown for plate 112 in FIG. 10. This provides improved vibration resistance for the module when installed on the circuit board.

FIG. 7 provides an enlarged side and partial cut-away view of the portion of module 60 indicated approximately by the circle in FIG. 6, showing further details of the preferred embodiment. For many power semiconductor devices pre-packaged in, for example the type TO-220 package, heat removal plate or die flag 12 is electrically hot. Since heat removal plate 62 is desirably (but not essentially) of a high thermal conductivity metal such as for example Cu or Al, it is necessary in many applications to electrically isolate heat removal flag 12 from heat conduction plate 62, while still providing for thermal coupling. This is conveniently accomplished by attaching surfaces 13, 13' of device heat removal flags 12, 12' of devices 10, 10' to surfaces 64, 64' of heat conductor plate 62 using electrically insulating but thermally conductive adhesive or attachment means 78, 78' of predetermined thickness 80. An epoxy containing heat conductive quartz spheres 82, 82' having a predetermined diameter is convenient. Such materials are well known in the art. The quartz spheres not only increase the thermal conductivity of the epoxy, but because their diameter is controlled within narrow limits, they provide a built-in thickness gage for controlling the thickness of adhesive 78, 78'. When pre-packaged devices 10, 10' are assembled on plate 62, adhesive 78, 78' is compressed until devices 10, 10' and plate 62 are separated only by the thickness of one layer of spheres 82, 82'. This gives a highly reproducible value for thickness 80. While quartz spheres are preferred, similar spacing control can also be obtained with spheres of other dielectric materials. Cloth or porous mats formed from dielectric fibers of uniform thickness can also be used. Woven glass or quartz cloth is an example, and such materials are well known in the art. Alternately, plate 62 may be of a high thermal conductivity dielectric or of a metal coated with a high thermal conductivity dielectric, in which case, adhesive 78, 78' need not be an insulator and may be, for example, a solder.

FIG. 8 shows an enlarged cross-sectional view of a portion of module 60 in the vicinity of mounting holes 14, 14' in mounting plate 12, 12' of devices 10, 10'. Rivet or other connector means 86 is provided extending through holes 14, 14' and matching hole 85 in heat conduction plate 62 to secure devices 10, 10' more firmly to plate 62. Insulating sleeve 88 and insulating washers 90, 90' are used to provide electrical isolation between connection means 86 and devices 10, 10' and plate 62. This provides a particularly robust structure. Thermally conductive attachment means 78, 78' is conveniently provided between flags 12, 12' and plate 62.

Figure 9:
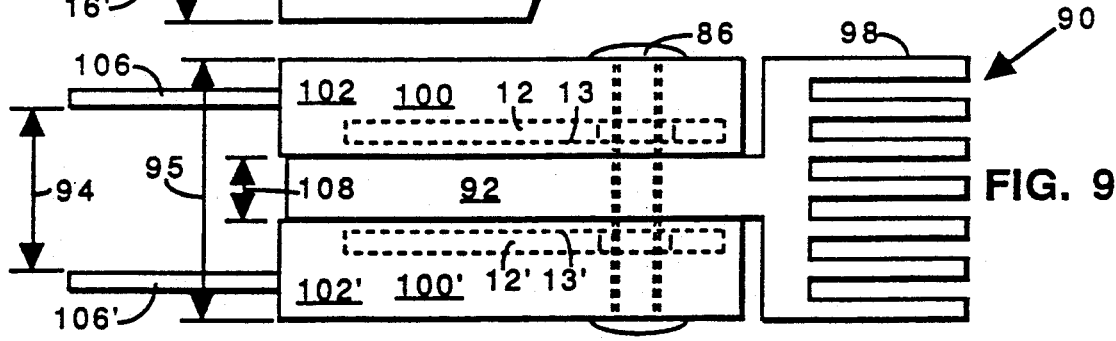
FIG. 9 is a simplified end view of a module according to a still further embodiment of the present invention.
Figure 10:
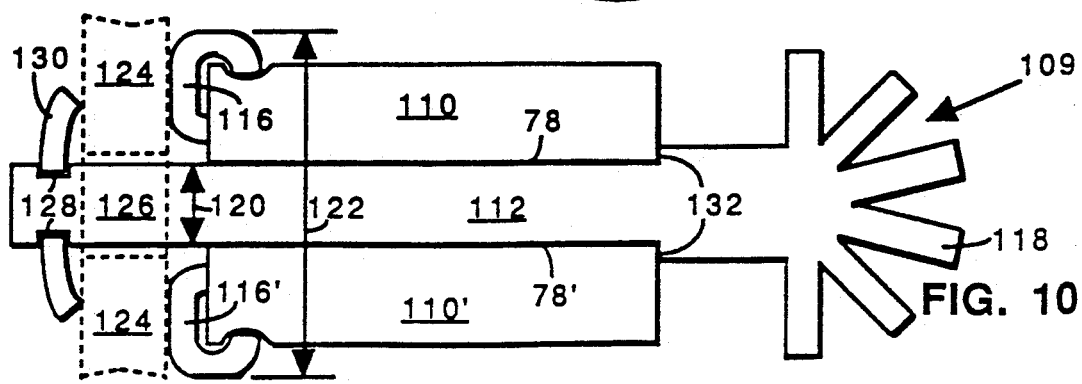
FIG. 10, is a simplified end view of a module according to a yet further embodiment of the prsent invention.

FIGS. 9 and 10 show end views similar to FIG. 6, but according to further embodiments of the present invention and illustrating additional features thereof. In FIG. 9, module 90 analogous to module 60 comprises heat conduction plate 92 analogous to plate 62 and pre-packaged devices 100, 100' analogous to devices 10, 10' with external electrical leads 106, 106' analogous to leads 16, 16', mounted thereon. Pre-packaged devices 100, 100' are of a type wherein plastic encapsulation 102, 102' is moulded so as to completely enclose die mount flag 12, 12' so that face 13, 13' thereof is not exposed, but contained within encapsulation 102, 102'. With this arrangement, the pre-packaged device is self isolating and attachment means 78, 78' may be omitted or made electrically conductive, as for example by use of metal fillers instead of dielectric fillers or other attachment means. This improves the thermal conductivity of attachment means 78. Any difference in the thickness of body 102, 102' of devices 100, 100' as compared to that of devices 10, 10' is taken up by adjusting thickness 108 of plate 92 so that the row-to-row spacing 94 of leads 106, 106' has the desired predetermined value, as for example, equal to spacing 74 in FIG. 6.

A feature of the present invention is that by appropriately choosing pre-packaged devices 10, 10' and 100, 100', the lead-to-lead spacing 34, 68 in the module may be chosen to match that of a standard JEDEC DIL package and by choosing heat conduction plate thickness 70, 108 the row-to-row spacing 74, 94 may be made to also match the row-to-row spacing of a standard JEDEC DIL. Thus, power device module module 60, 90 can be accommodated in substantially the same footprint as an established JEDEC IC package outline. While overall thickness 75, 95 (see FIGS. 6, 9), may be larger than body thickness 44 (see FIG. 3), this is usually not a limitation, since the packing density of such DIL devices is usually controlled by row-to-row spacing 74 rather than the body width. That is, space must be left between the attachment pads of adjacent devices on the circuit board, and such spacing is more than large enough to accommodate body width 75, 95 of module 60, 90. Thus, those engaged in circuit board design may accommodate the invented type of module in substantially the same footprint ordinarily used, for example, for DIL IC's, and they do not have to modify their design programs to accommodate a custom footprint for the power module. This is a significant practical advantage.

FIG. 9 shows an additional feature of the present inventign in that heat conduction plate 92 has been provided with heat dissipation fins 98 to facilitate heat removal from module 90. Fins 98 are arranged in FIG. 9 to have substantially the same width as module body width 95. This provides for a vary compact arrangement. This is an additional feature of the present invention. Rivet 86 may be omitted.

FIG. 10 which is an end view analogous to FIG. 9, shows a further embodiment of the present invention in which module 109 comprises pre-packaged devices 110, 110' analogous to devices 10, 10' mounted on heat conduction plate 112 analogous to plate 62 and having finned radiator 118 analogous to radiator 98, but where electrical connection leads 116, 116' are of the J-form type typically associated with pre-packaged surface mount devices. By adjusting thickness 120 of heat conduction plate 112, spacing 122 between leads 116, 116' may be adjusted to match the footprint of pre-existing JEDEC surface mount devices or other standard device footprints. While devices 110, 110' are shown as being attached so that J-form leads 116, 116' extend outwardly, i.e., away from plate 112, they can also be attached so as to be oriented inwardly, i.e., toward plate 112. This allows further variation in row-to-row spacing 122. In that situation plate 112 does not protrude beyond package 110, 140' and stops short of leads 116, 116', so as not to interface therewith when the leads are inward facing.

FIG. 10 shows a further variation of the present invention wherein plate 112 has extension portion 126 adapted to pass through an opening in PC board 124. Extension portion 126 has notch 128 for receiving spring clip or other retention means 130 which hold module 109 against circuit 124. Shoulder 132 bearing against the body of device 110, 100' absorbs any shear force which might otherwise be present in attachment means 78, 78' between device 110, 110' and plate 112, as a result of using spring clip 130 to pull press leads 116, 116' of module 109 against PC board 124.

The above described modules are desirably formed by providing multiple pre-packaged power devices each having a planar heat removal face and external connection leads extending from another face, providing a heat conductive plate having opposed first and second planar faces, bonding the planar heat removal faces of a first portion of the multiple pre-packaged power devices to the first face of the heat conductive plate and the planar heat removal faces of a second portion of the multiple pre-packaged power devices to the second face of the heat conductive plate so that the external connection leads of the multiple pre-packaged semiconductor devices extend away from the heat conductive plate in a common direction.

It is desirable that the bonding step comprises, bonding the heat removal faces to the opposed faces of the heat conductive plate with a thermally conductive bonding media containing means for controlling the separation of the heat removal faces and the heat conductive faces. It is further desirable that the second providing step and the bonding step comprise, adjusting the thickness of the heat conductive plate so that, when the multiple pre-packaged power devices are bonded to the heat conductive plate, the external electrical leads of the first portion form a row and the external electrical leads of the second portion form a parallel row, wherein the row-to-row spacing equals a pre-determined JEDEC spacing.

A further feature of power device module of the present invention is that, because it uses individually pre-packaged and pre-tested devices which have been subjected to full functional testing prior to installation in the module, there is little or no yield loss due to substandard device performance at the module level. This eliminates a substantial cost factor over prior art approaches. A further cost savings associated with the use of pre-packaged devices is that such devices are ordinarily manufactured in much larger volumes than are modules. Thus, there are great economics of scale in the production of such individual devices which benefit the module. This is not true of prior art fully integrated approaches or chip-module approaches where the larger die technology and/or chip-module assembly technology is practiced in much lower volume. Further, since assembly of the invented modules is simple and does not require any device interconnections within the module, such assembly is particularly inexpensive. These factors combine to provide modules that are particularly economical and cost effective as compared to prior art approaches. In addition, by virtue of their very simple construction and footprint, the invented modules are rugged and easy to use.

An additional factor of practical importance is that the assembly technology for enclosing the semiconductor die is unchanged, i.e., the invented modules use fully qualified, pre-packaged devices. As a result, the module qualification cycle and cost is much reduced as compared to prior art approaches wherein either the die is much enlarged or multiple die are enclosed within a common encapsulation. It is well known in the art that when the encapsulation arrangement is altered, full electrical re-qualification of the parts for useful life (MTBF) and stability is required because there is a strong interaction between the encapsulation and the semiconductor die surface which affects these factors. Such re-qualification is very expensive and time consuming. With the present module electrical re-qualification is not required because no change has been made in the die-encapsulation interface.

It will be apparent from the foregoing explanation that the invented power device module is particularly compact and space efficient, that it is low in cost, that it can have a circuit board footprint that conforms to familiar JEDEC registered devices to simplify circuit board design and module installation, and that it requires little if any electrical re-qualification prior to use. These are particular advantages of the present invention.

For convenience of explanation, the present invention is described in terms of particular semiconductor devices, e.g., transistors, diodes, etc., and particular package configurations, e.g., type TO-220, DIL, etc. However, those of skill in the art will understand based on the explanation herein that this is not intended to be limiting and that any semiconductor device and many different package designs can be used with the present invention. Those of skill in the art will further appreciate based on the description herein that while the invention is illustrated in terms of leads that extend away from the package and module or are bent into a J-form, that other lead configurations can also be used, as for example and not limited to, L-form leads, Z-form leads, dog-leg or stepped leads, and other variations well known in the art. Further, while the encapsulation has been generally illustrated as being formed of plastic because of its widespread use, those of skill in the art will understand that the present invention is not limited to devices employing such encapsulation and that prepackaged devices of any enclosure material can be used. Still further, while heat conductive plate 62, 92, 112 has generally been described as a thermally conductive metal or metal plus insulator it may be of any material e.g., dielectric thermal conductivity to remove the required amount of heat from the prepackaged devices. Accordingly, it is intended to include these and such other variations as will occur to those of skill in the art based on the description herein in the claims that follow.

I claim:

1. A method for forming a power device module, comprising:

providing multiple pre-packaged power devices each having a planar heat removal face and external connection leads extending from an other face;

providing a heat conductive plate having opposed first and second planar faces;

bonding the planar heat removal faces of a first plurality of the multiple pre-packaged power devices to the first face of the heat conductive plate and the planar heat removal faces of a second plurality of the multiple pre-packaged power devices to the second face of the heat conductive plate so that the external connection leads of the multiple pre-packaged semiconductor devices extend away from the heat conductive plate in a common direction.

2. The method of claim 1 wherein the bonding step comprises, bonding the heat removal faces to the opposed faces of the heat conductive plate with a thermally conductive bonding media containing means for controlling the separation of the heat removal faces and the heat conductive faces.

3. The method of claim 1 wherein the second providing step and the bonding step comprise, adjusting the thickness of the heat conductive plate so that, when the multiple pre-packaged power devices are bonded to the heat conductive plate, the external electrical leads of the first portion form a row and the external electrical leads of the second portion form a parallel row, wherein the row-to-row spacing equals a pre-determined JEDEC spacing.

* * * * *